(12) United States Patent
Nishiguchi

(10) Patent No.: US 11,876,132 B2
(45) Date of Patent: Jan. 16, 2024

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Toshifumi Nishiguchi, Hakusan Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 100 days.

(21) Appl. No.: 17/470,647

(22) Filed: Sep. 9, 2021

(65) Prior Publication Data

US 2022/0302302 A1 Sep. 22, 2022

(30) Foreign Application Priority Data

Mar. 19, 2021 (JP) .................................. 2021-045559

(51) Int. Cl.
*H01L 29/78* (2006.01)
*H01L 29/66* (2006.01)
(Continued)

(52) U.S. Cl.
CPC ...... *H01L 29/7813* (2013.01); *H01L 29/1095* (2013.01); *H01L 29/407* (2013.01);
(Continued)

(58) Field of Classification Search
CPC ............. H01L 29/7813; H01L 29/1095; H01L 29/407; H01L 29/4236; H01L 29/42364;
(Continued)

(56) References Cited

U.S. PATENT DOCUMENTS 7,045,858 B2 * 5/2006 Matsuda ............. H01L 29/7813
257/329
7,541,642 B2 6/2009 Kawamura et al.
(Continued)

FOREIGN PATENT DOCUMENTS

JP 2007-035841 A 2/2007
JP 3930486 B2 6/2007
(Continued)

*Primary Examiner* — Shahed Ahmed
*Assistant Examiner* — Khatib A Rahman
(74) *Attorney, Agent, or Firm* — Allen & Overy LLP

(57) ABSTRACT

A semiconductor device includes a first electrode; a first semiconductor region provided on the first electrode; a second semiconductor region provided on the first semiconductor region; a third semiconductor region provided on the second semiconductor region; a second electrode provided on the third semiconductor region and electrically connected to the third semiconductor region; a third electrode aligned with the first semiconductor region and the second semiconductor region; a gate electrode provided between the third electrode and the second semiconductor region; a first insulating portion including a first insulating region provided between the third electrode and the first semiconductor region and facing the third electrode, a second insulating region facing the first semiconductor region, and at least one air-gap region located between the first insulating region and (Continued)

the second insulating region; and a second insulating portion provided between the gate electrode and the second semiconductor region.

7 Claims, 9 Drawing Sheets

(51) Int. Cl.
  *H01L 29/10* (2006.01)
  *H01L 29/49* (2006.01)
  *H01L 29/423* (2006.01)
  *H01L 29/40* (2006.01)
  *H01L 29/94* (2006.01)
(52) U.S. Cl.
  CPC .... *H01L 29/4236* (2013.01); *H01L 29/42364* (2013.01); *H01L 29/4991* (2013.01); *H01L 29/66734* (2013.01); *H01L 29/94* (2013.01)
(58) Field of Classification Search
  CPC ........... H01L 29/4991; H01L 29/66734; H01L 29/94; H01L 29/401; H01L 29/41766; H01L 29/515
  See application file for complete search history.

(56) References Cited

U.S. PATENT DOCUMENTS

| | | | |
|---|---|---|---|
| 10,236,377 B2 * | 3/2019 | Katoh | ............... H01L 29/42368 |
| 10,573,732 B2 * | 2/2020 | Iwakaji | ............... H01L 29/4236 |
| 2011/0062547 A1 * | 3/2011 | Onishi | ............... H01L 27/0922 |
| | | | 438/421 |
| 2013/0134505 A1 * | 5/2013 | Kobayashi | .......... H01L 29/7813 |
| | | | 438/270 |
| 2015/0380538 A1 | 12/2015 | Ogawa | |
| 2016/0276430 A1 | 9/2016 | Okumura et al. | |
| 2017/0069714 A1 | 3/2017 | Tsuchitani et al. | |
| 2017/0077298 A1 | 3/2017 | Ito et al. | |
| 2017/0263767 A1 | 9/2017 | Nishiwaki | |
| 2017/0330943 A1 | 11/2017 | Haase et al. | |

FOREIGN PATENT DOCUMENTS

| | | |
|---|---|---|
| JP | 4790237 B2 | 10/2011 |
| JP | 2017-054959 A | 3/2017 |
| JP | 6317694 B2 | 4/2018 |
| JP | 6426642 B2 | 11/2018 |
| JP | 6433934 B2 | 12/2018 |
| WO | 2015/019862 A1 | 2/2015 |

* cited by examiner

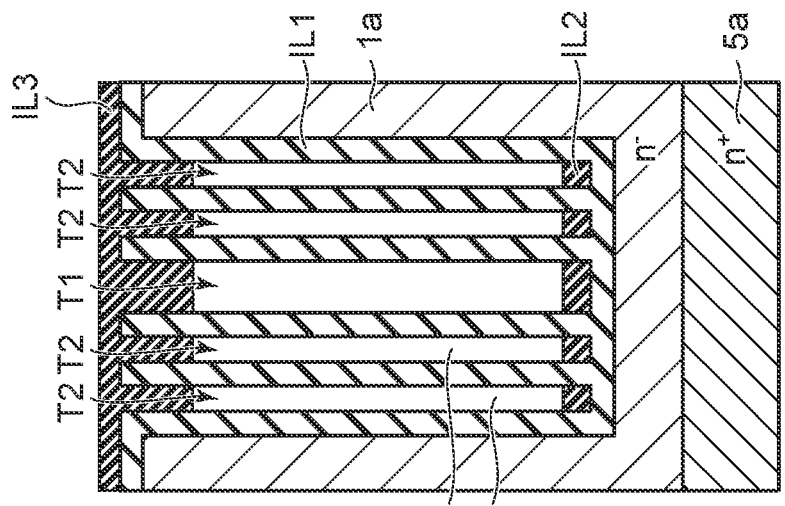
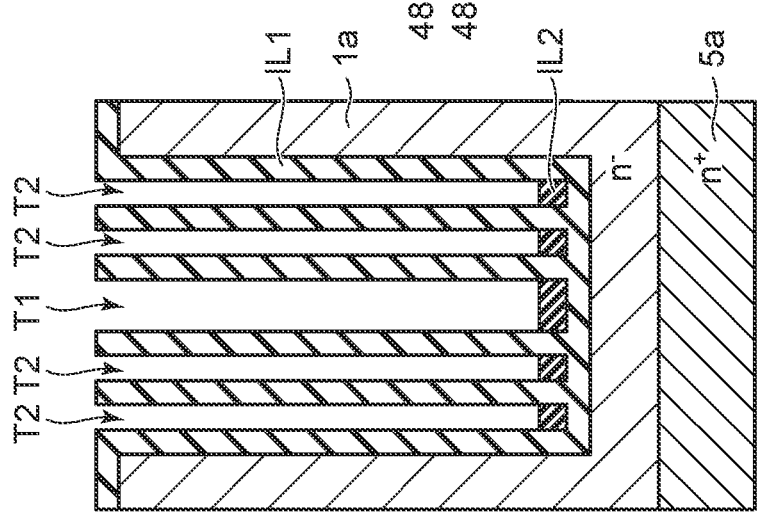
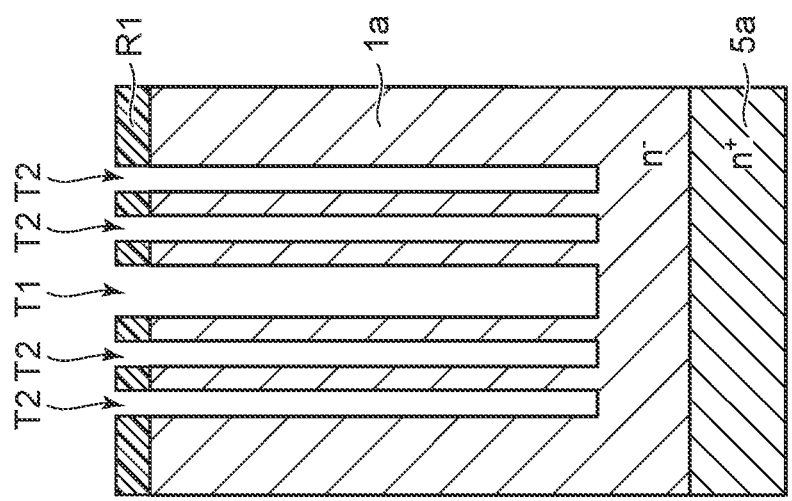

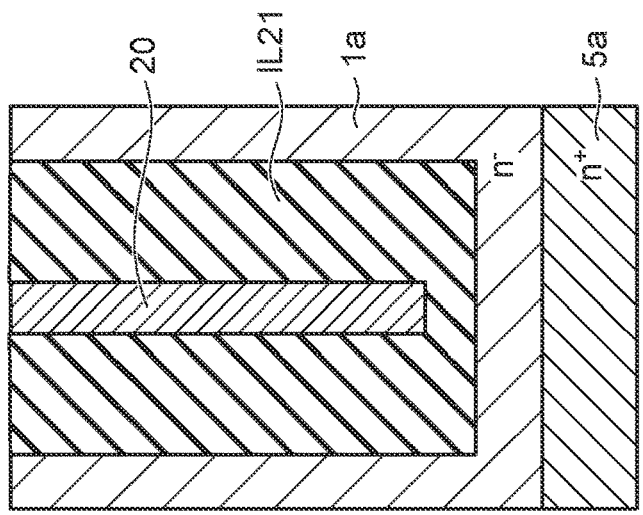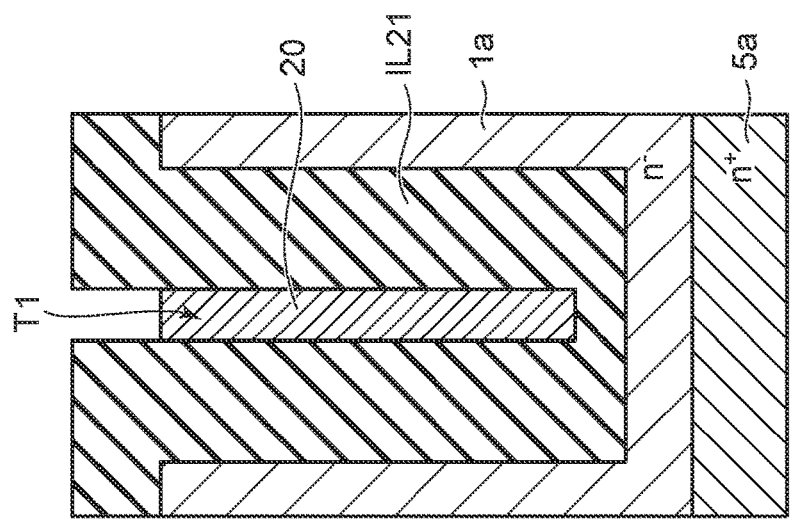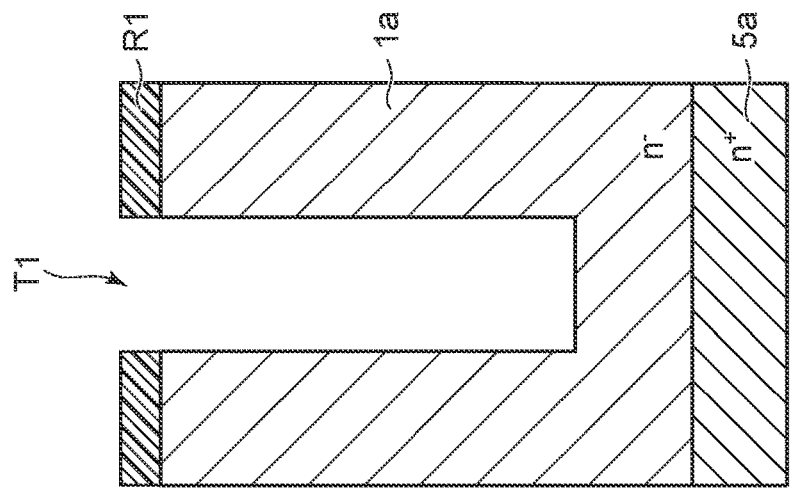

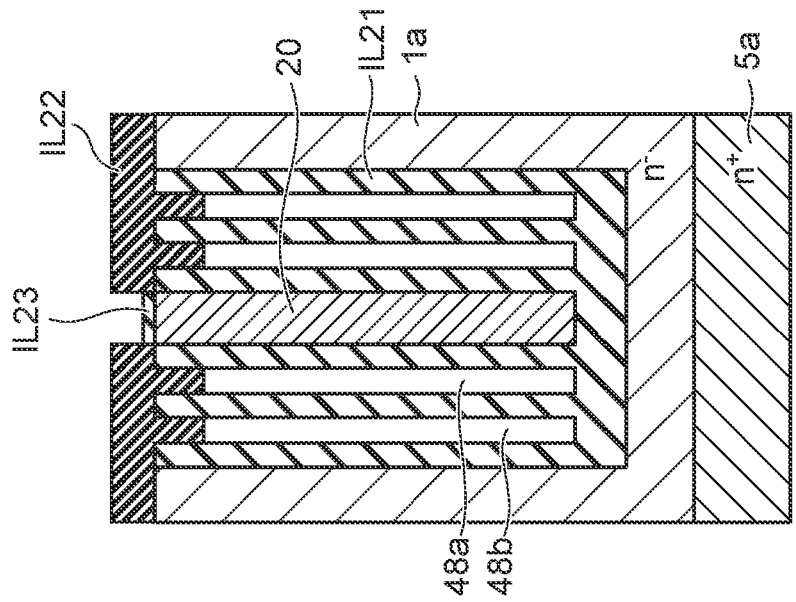
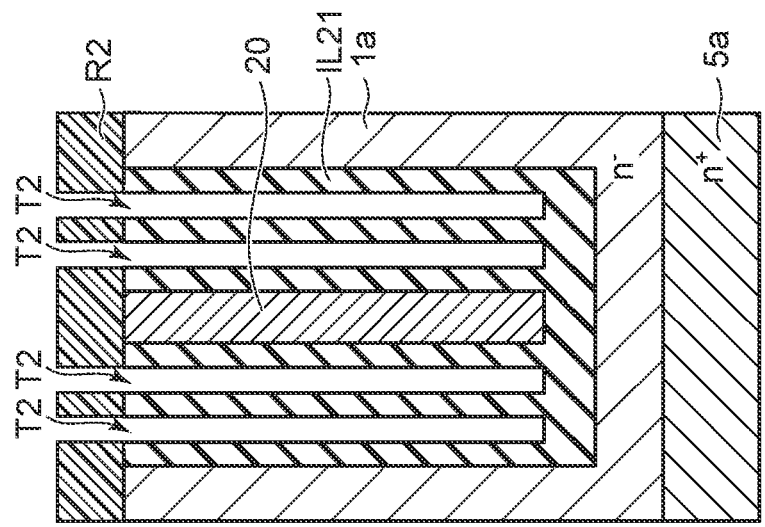

SEMICONDUCTOR DEVICE

CROSS-REFERENCE TO RELATED APPLICATIONS

This application is based upon and claims the benefit of priority from Japanese Patent Application No. 2021-045559, filed on Mar. 19, 2021; the entire contents of which are incorporated herein by reference.

FIELD

Embodiments of the invention relate to semiconductor devices.

BACKGROUND

Semiconductor devices such as metal oxide semiconductor field effect transistors (MOSFETs) are used in applications such as power conversion. There is a demand for reduction of parasitic capacitance in semiconductor devices.

BRIEF DESCRIPTION OF THE DRAWINGS

FIGS. 2A to 2C are process cross-sectional views showing an example of a process of manufacturing the semiconductor device according to the first embodiment.

FIGS. 7A to 7C are process cross-sectional views showing another variation of the process of manufacturing the semiconductor device according to the first embodiment.

FIGS. 8A and 8B are process cross-sectional views showing still another variation of the process of manufacturing the semiconductor device according to the first embodiment.

DETAILED DESCRIPTION

Figure 1:
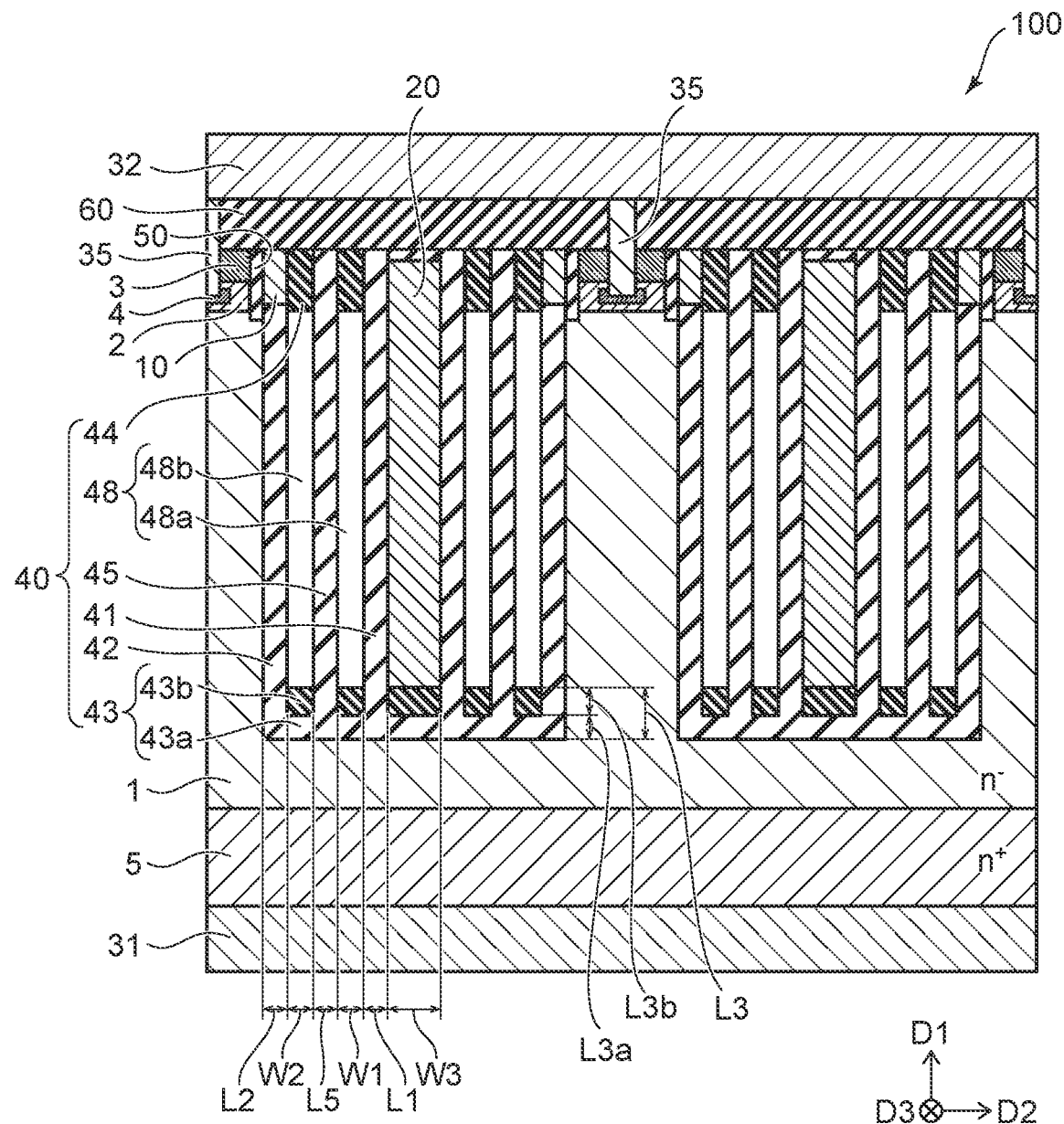
FIG. 1 is a cross-sectional view showing a semiconductor device according to a first embodiment.

A semiconductor device according to an embodiment includes a first electrode, a first conductivity type first semiconductor region, a second conductivity type second semiconductor region, a first conductivity type third semiconductor region, a second electrode, a third electrode, a gate electrode, a first insulating portion, and a second insulating portion. The first semiconductor region is provided on the first electrode. The second semiconductor region is provided on the first semiconductor region. The third semiconductor region is selectively provided on the second semiconductor region. The second electrode is provided on the third semiconductor region and is electrically connected to the third semiconductor region. The third electrode is aligned with the first semiconductor region and the second semiconductor region in a second direction perpendicular to the first direction from the first electrode toward the first semiconductor region. The gate electrode is provided between the third electrode and the second semiconductor region in the second direction. The first insulating portion is provided between the third electrode and the first semiconductor region in the second direction. The first insulating portion includes a first insulating region, a second insulating region, and at least one air-gap region. The first insulating region faces the third electrode in the second direction. The second insulating region faces the first semiconductor region in the second direction. The air-gap region is located between the first insulating region and the second insulating region in the second direction. The second insulating portion is provided between the gate electrode and the second semiconductor region in the second direction.

Hereinafter, the embodiments of the invention will be described with reference to the drawings.

The drawings are schematic or conceptual, and the relationship between the thicknesses and widths of respective portions, the ratio of the sizes between the portions, and the like are not necessarily the same as the actual ones. Even in a case where the same portions are represented, the dimensions and the ratios of the respective portions in the drawings may be represented differently.

In the specification and the drawings, the same elements as those already described are denoted by the same reference numerals, and detailed description of the elements will be omitted as appropriate.

In the following description and drawings, the notations $n^+$, $n^-$, $p^+$, and p represent the relative levels of each impurity concentration. That is, the notation attached with "+" represents to have a relatively higher impurity concentration than the notation not attached with any one of "+" and "−", and the notation attached with "−" represents to have a relatively lower impurity concentration than the notation not attached with any one of "+" and "−". These notations represent the relative levels of net impurity concentrations after the impurities have compensated for each other when impurities to be acceptors and impurities to be donors are contained in each region.

With respect to each of the embodiments described below, the p type and the n type of each semiconductor region may be inverted to carry out each of the embodiments.

First Embodiment

FIG. 1 is a cross-sectional view showing a semiconductor device according to a first embodiment.

A semiconductor device 100 according to the first embodiment is, for example, a MOSFET. As shown in FIG. 1, the semiconductor device 100 according to the first embodiment includes an $n^-$-type (first conductivity type) drift region 1 (first semiconductor region), a p-type (second conductivity type) base region 2 (second semiconductor region), an $n^+$-type source region 3 (third semiconductor region), a $p^+$-type contact region 4, an $n^+$-type drain region 5, a gate electrode 10, an FP electrode 20 (third electrode), a drain electrode 31 (first electrode), a source electrode 32 (second electrode), a via 35, an FP insulating portion 40 (first insulating portion), a gate insulating portion 50 (second insulating portion), and an interlayer insulating portion 60 (third insulating portion). It is noted that "FP" denotes "field plate".

In the following description of each embodiment, a first direction D1, a second direction D2, and a third direction D3 are used. A direction from the drain electrode 31 toward the $n^-$-type drift region 1 is defined as the first direction D1. One direction perpendicular to the first direction D1 is referred to as the second direction D2. A direction perpendicular to the first direction D1 and intersecting the second direction D2 is referred to as the third direction D3. In addition, for the description, the direction from the drain electrode 31 toward the n⁻-type drift region 1 is referred to as an "upward" direction, and the opposite direction is referred to as a "downward" direction. These directions are based on a relative positional relationship between the drain electrode 31 and the n⁻-type drift region 1 and are independent of the direction of gravity.

As shown in FIG. 1, the drain electrode 31 is provided on the lower surface of the semiconductor device 100. The n⁻-type drift region 1 is provided on the drain electrode 31 via the n⁺-type drain region 5. The n⁻-type drift region 1 is electrically connected to the drain electrode 31 via the n⁺-type drain region 5. The p-type base region 2 is provided on the n⁻-type drift region 1. The n⁺-type source region 3 and the p⁺-type contact region 4 are selectively provided on the p-type base region 2.

The FP electrode 20 is aligned with the n⁻-type drift region 1 and the p-type base region 2 in the second direction D2. That is, the FP electrode 20 is provided at a position overlapping the n⁻-type drift region 1 and the p-type base region 2 in the second direction D2. The FP electrode 20 may be aligned with the n⁺-type source region 3 in the second direction D2. That is, the FP electrode 20 may be provided at a position overlapping the n⁺-type source region 3 in the second direction D2.

The FP insulating portion 40 is provided between the FP electrode 20 and the n⁻-type drift region 1 in the second direction D2. In the example, a portion of the FP insulating portion 40 is provided between the FP electrode 20 and the n⁻-type drift region 1 in the second direction D2, and the other portion of the FP insulating portion 40 is provided between the FP electrode 20 and the gate electrode 10 in the second direction D2. Accordingly, the gate electrode 10 and the FP electrode 20 are electrically separated from each other.

The FP insulating portion 40 includes a first insulating region 41, a second insulating region 42, and at least one air-gap region 48. The first insulating region 41 faces the FP electrode 20 in the second direction D2. In the example, the first insulating region 41 is in contact with the FP electrode 20 in the second direction D2. The second insulating region 42 faces the n⁻-type drift region 1 in the second direction D2. In the example, the second insulating region 42 is in contact with the n⁻-type drift region 1 in the second direction D2. The air-gap region 48 is located between the first insulating region 41 and the second insulating region 42 in the second direction D2. The air-gap region 48 is an air-gap provided inside the FP insulating portion 40. For example, the air-gap region 48 may contain air or may be in vacuum.

For example, the air-gap region 48 does not overlap the FP electrode 20 in the first direction D1. The air-gap region 48 is, for example, aligned with the FP electrode 20 in the second direction D2. The lower end of the air-gap region 48 is located, for example, at the same height as the lower end of the FP electrode 20. The upper end of the air-gap region 48 is located, for example, below the upper end of the FP electrode 20.

In the example, the FP insulating portion 40 further includes a third insulating region 43, a fourth insulating region 44, and a fifth insulating region 45.

The third insulating region 43 is provided below the air-gap region 48 and below the FP electrode 20. A portion of the third insulating region 43 is located between the air-gap region 48 and the n⁻-type drift region 1 in the first direction D1. The other portion of the third insulating region 43 is located between the FP electrode 20 and the n⁻-type drift region 1 in the first direction D1. The third insulating region 43 has, for example, a first portion 43a and a second portion 43b. The first portion 43a is provided between the second portion 43b and the n⁻-type drift region 1 in the first direction D1. That is, the second portion 43b is provided on the first portion 43a.

A thickness L3 of the third insulating region 43 in the first direction D1 is larger than, for example, a thickness L1 of the first insulating region 41 in the second direction D2. In addition, the thickness L3 of the third insulating region 43 in the first direction D1 is larger than, for example, a thickness L2 of the second insulating region 42 in the second direction D2. In the example, the thickness L1 is the same as the thickness L2. The thickness L1 may be larger than the thickness L2 or may be smaller than the thickness L2. The thickness L3 is represented by a sum of a thickness L3a of the first portion 43a in the first direction D1 and a thickness L3b of the second portion 43b in the first direction D1. The thickness L3a is, for example, the same as the thickness L2.

The fourth insulating region 44 is provided above the air-gap region 48. A portion of the fourth insulating region 44 is provided between the air-gap region 48 and the source electrode 32 in the first direction D1. The other portion of the fourth insulating region 44 is provided between the first insulating region 41 and the source electrode 32 in the first direction D1. The other portion of the fourth insulating region 44 is provided between the fifth insulating region 45 and the source electrode 32 in the first direction D1.

The fifth insulating region 45 is provided between the first insulating region 41 and the second insulating region 42 in the second direction D2. Accordingly, the fifth insulating region 45 divides the air-gap region 48 in the second direction D2. A thickness L5 of the fifth insulating region 45 in the second direction D2 is, for example, the same as the thickness L2. The thickness L5 may be larger than the thickness L2 or may be smaller than the thickness L2.

In the example, one fifth insulating region 45 is provided between the first insulating region 41 and the second insulating region 42, and the FP insulating portion 40 includes a first air-gap region 48a and a second air-gap region 48b arranged along the second direction. That is, the air-gap region 48 includes the first air-gap region 48a and the second air-gap region 48b. The first air-gap region 48a is located between the first insulating region 41 and the fifth insulating region 45 in the second direction D2. The second air-gap region 48b is located between the fifth insulating region 45 and the second insulating region 42 in the second direction D2.

In the example, a width W1 of the first air-gap region 48a in the second direction D2 is the same as a width W2 of the second air-gap region 48b in the second direction D2. The width W1 may be larger than the width W2 or may be smaller than the width W2. As described above, the widths of the air-gap regions 48 may be the same as or different from each other. The width of each air-gap region 48 is smaller than, for example, a width W3 of the FP electrode 20 in the second direction D2.

The multiple fifth insulating regions 45 may be arranged along the second direction D2. That is, the air-gap region 48 may be divided into three or more in the second direction D2. In addition, the fifth insulating region 45 may not be provided. That is, the air-gap region 48 may not be divided in the second direction D2.

The gate electrode 10 is provided between the FP electrode 20 and the p-type base region 2 and between the FP electrode 20 and the n$^+$-type source region 3 in the second direction D2.

The gate insulating portion 50 is provided between the gate electrode 10 and the p-type base region 2 and between the gate electrode 10 and the n$^+$-type source region 3 in the second direction D2. The gate insulating portion 50 may be provided between the gate electrode 10 and the n$^-$-type drift region 1 in the second direction D2.

The FP electrode 20 is interposed between the FP insulating portions 40 in the second direction D2. That is, the FP insulating portions 40 are provided on both sides of the FP electrode 20 with the sides separated in the second direction D2. In addition, the FP electrode 20 and the FP insulating portion 40 are interposed between the n$^-$-type drift regions 1 in the second direction D2. That is, the n$^-$-type drift region 1 is provided on both sides of the FP electrode 20 and the FP insulating portion 40 with the sides separated in the second direction D2. The multiple FP electrodes 20 and the multiple FP insulating portions 40 are provided along the second direction D2. Each of the FP electrodes 20 and each of the FP insulating portions 40 are continuously provided along the third direction D3.

The multiple gate electrodes 10 are provided along the second direction D2. The gate electrode 10 is continuously provided along the third direction D3. The FP electrode 20 is provided between the two gate electrodes 10 in the second direction D2. The p-type base region 2, the n$^+$-type source region 3, and the p$^+$-type contact region 4 are provided at positions facing the respective multiple gate electrodes 10. The configuration of the FP insulating portions 40 disposed on both sides of one FP electrode 20 is substantially symmetrical with the FP electrode 20 as the center in the second direction D2.

The interlayer insulating portion 60 is provided on the p-type base region 2, the n$^+$-type source region 3, the gate electrode 10, the FP electrode 20, and the FP insulating portion 40. The interlayer insulating portion 60 is located between the n$^+$-type source region 3 and the source electrode 32, between the gate electrode 10 and the source electrode 32, between the FP electrode 20 and the source electrode 32, and between the FP insulating portion 40 and the source electrode 32 in the first direction D1.

The source electrode 32 is provided on the interlayer insulating portion 60. The source electrode 32 is located on the p-type base region 2, the n$^+$-type source region 3, the gate electrode 10, the FP electrode 20, and the FP insulating portion 40. In the first direction D1, the columnar via 35 extending in the first direction D1 is provided between the source electrode 32 and the p-type base region 2. The via 35 extends (or passes through) the interlayer insulating portion 60 and the n$^+$-type source region 3 in the first direction D1 from the lower surface of the source electrode 32 and reaches the p-type base region 2. The p-type base region 2 and the n$^+$-type source region 3 are electrically connected to the source electrode 32 via the via 35. For example, the source electrode 32 is electrically connected to the multiple n$^+$-type source regions 3 aligned along the second direction D2 via the via 35.

The p$^+$-type contact region 4 is provided between the p-type base region 2 and the via 35. The p-type base region 2 is electrically connected to the source electrode 32 via the p$^+$-type contact region 4 and the via 35. In the example, the p$^+$-type contact region 4 is located below the n$^+$-type source region 3.

The FP electrode 20 is electrically connected to the source electrode 32. Each of the FP electrodes 20 is electrically connected to the source electrode 32 via a connection portion, for example, at the end of the FP electrodes 20 in the third direction D3.

The gate electrode 10 is electrically separated from the source electrode 32. The gate electrode 10 is electrically connected to the gate pad via the gate interconnect, for example, at the end of the gate electrode 10 in the third direction D3.

The operations of the semiconductor device 100 will be described.

In a state where a positive voltage is applied to the drain electrode 31 with respect to the source electrode 32, a voltage of a threshold value or more is applied to the gate electrode 10. Accordingly, a channel (inversion layer) is formed in the p-type base region 2, and the semiconductor device 100 is turned on. Electrons flow from the source electrode 32 to the drain electrode 31 through the channel. After that, when the voltage applied to the gate electrode 10 becomes lower than the threshold value, the channel in the p-type base region 2 disappears, and the semiconductor device 100 is turned off.

When the semiconductor device 100 is switched to the off state, the positive voltage applied to the drain electrode 31 with respect to the source electrode 32 increases. That is, the potential difference between the n$^-$-type drift region 1 and the FP electrode 20 increases. Due to the increase in potential difference, a depletion layer spreads from the interface between the FP insulating portion 40 and the n$^-$-type drift region 1 toward the n$^-$-type drift region 1. The depletion layer mainly extends in the first direction D1 and the second direction D2, and the adjacent depletion layers extending from the adjacent FP insulating portions 40 are connected to each other. Accordingly, the depletion layer is formed in substantially the entire portion disposed between the adjacent FP insulating portions 40 in the n$^-$-type drift region 1. A breakdown voltage of the semiconductor device 100 can be increased by spreading the depletion layer. Alternatively, the on-resistance of the semiconductor device 100 can be reduced by increasing the concentration of the impurities to be donors in the n$^-$-type drift region 1 while the breakdown voltage of the semiconductor device 100 is maintained.

An example of the material of each component of the semiconductor device 100 will be described.

The n$^-$-type drift region 1, the p-type base region 2, the n$^+$-type source region 3, the p$^+$-type contact region 4, and the n$^+$-type drain region 5 contain silicon, silicon carbide, gallium nitride, or gallium arsenide as semiconductor materials. When silicon is used as the semiconductor material, arsenic, phosphorus, or antimony can be used as an impurity to be a donor. Boron can be used as an impurity to be an acceptor.

The gate electrode 10 and the FP electrode 20 include a conductive material such as polysilicon. Impurities may be added to the conductive material. The FP insulating portion 40, the gate insulating portion 50, and the interlayer insulating portion 60 contain an insulating material. For example, the FP insulating portion 40, the gate insulating portion 50, and the interlayer insulating portion 60 contain silicon oxide or silicon nitride. The drain electrode 31 and the source electrode 32 contain a metal such as aluminum or copper. The via 35 contains a metal such as tungsten, aluminum, or copper.

Next, an example of the method for manufacturing the semiconductor device 100 will be described with reference to FIG. 2A to FIG. 4C.

FIGS. 2A to 2C, FIGS. 3A to 3C, and FIGS. 4A to 4C are process cross-sectional views showing examples of the processes of manufacturing the semiconductor device according to the first embodiment.

First, a semiconductor substrate having an n$^+$-type semiconductor layer 5a and an n$^-$-type semiconductor layer 1a is prepared. Next, a main trench T1 and a side trench T2 that are recessed in the first direction D1 and extend in the third direction D3 are formed on the surface of the n$^-$-type semiconductor layer 1a by photolithography and etching using a resist R1 (FIG. 2A). The depth of the main trench T1 is, for example, the same as the depth of the side trench T2. The width of the main trench T1, that is, the length in the second direction D2 is allowed to be larger than, for example, the width of the side trench T2.

Next, the resist R1 is removed, and an insulating layer IL1 is formed on an inner surface of the main trench T1, an inner surface of the side trench T2, and the upper surface of the n$^-$-type semiconductor layer 1a by thermally oxidizing the n$^-$-type semiconductor layer 1a. Accordingly, the n$^-$-type semiconductor layer 1a located between the main trench T1 and the side trench T2 and the n$^-$-type semiconductor layer 1a located between the side trenches T2 become the insulating layer IL1 over the entire area in the second direction D2. Subsequently, an insulating layer IL2 made of the same material as the insulating layer IL1 is formed on the bottoms of the main trench T1 and the side trench T2 by anisotropic CVD (FIG. 2B). The anisotropic CVD is performed, for example, by plasma CVD. The insulating layer IL2 may be made of a material having a dielectric constant different from that of the insulating layer ILL The formation of the insulating layer IL2 is performed as needed and can be omitted.

Next, an insulating layer IL3 is formed by cap CVD so as to close the upper portions of the main trench T1 and the side trench T2 (FIG. 2C). For example, the insulating layer IL3 is formed so that a portion of the insulating layer IL3 is located below the upper end of the side trench T2. Accordingly, the first air-gap region 48a and the second air-gap region 48b are formed. The cap CVD is performed by atmospheric pressure CVD using, for example, monosilane having poor step coverage.

Figure 3A:
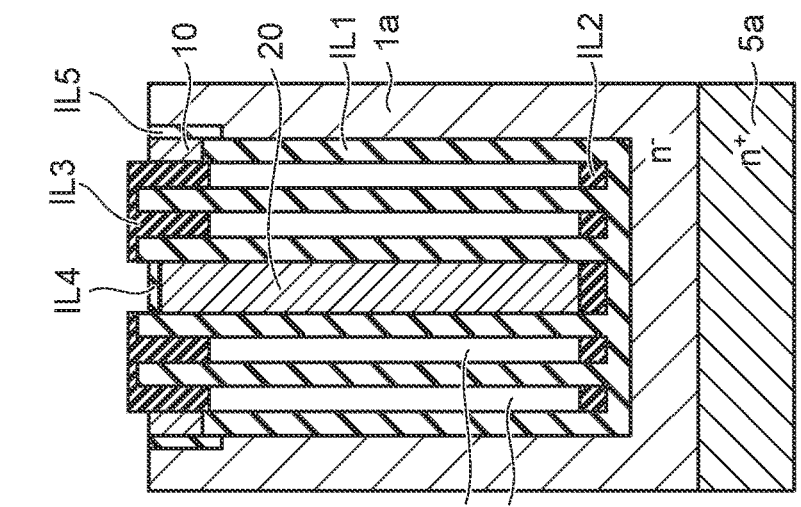
FIGS. 3A to 3C are process cross-sectional views showing an example of a process of manufacturing the semiconductor device according to the first embodiment.

Next, the insulating layer IL3 that closes the upper portion of the main trench T1 is removed by etching, and a conductive layer is formed inside the main trench T1. The FP electrode 20 is formed by performing etching back on the upper surface of the conductive layer. Subsequently, an insulating layer IL4 along the upper surface of the FP electrode 20 is formed by thermally oxidizing the upper portion of the FP electrode 20 (FIG. 3A). The formation of the insulating layer IL4 is performed as needed and can be omitted.

Figure 3B:
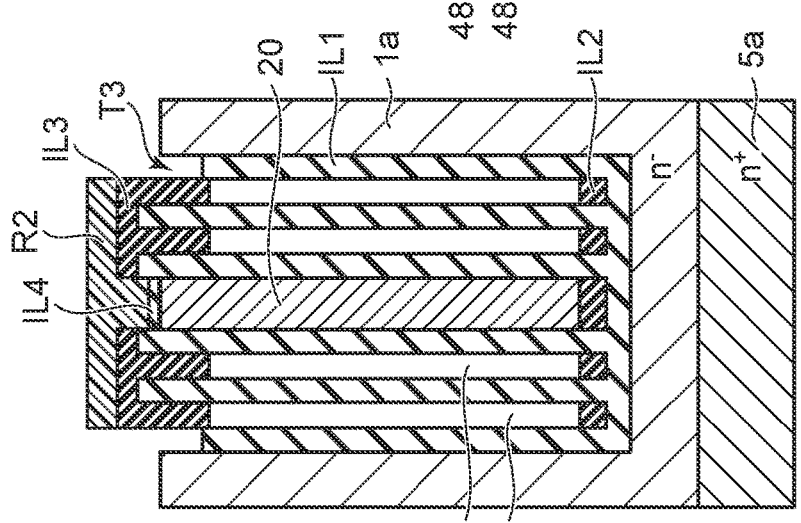

Next, a portion of the insulating layer IL1 and a portion of the insulating layer IL3 are removed by photolithography and wet etching using a resist R2, an upper surface and an inner side surface of the n$^-$-type semiconductor layer 1a are exposed, and a trench T3 is formed between the n$^-$-type semiconductor layer 1a and the insulating layer IL3 (FIG. 3B). At this time, the lower end of the trench T3 is located above the lower end of the insulating layer IL3.

Figure 3C:
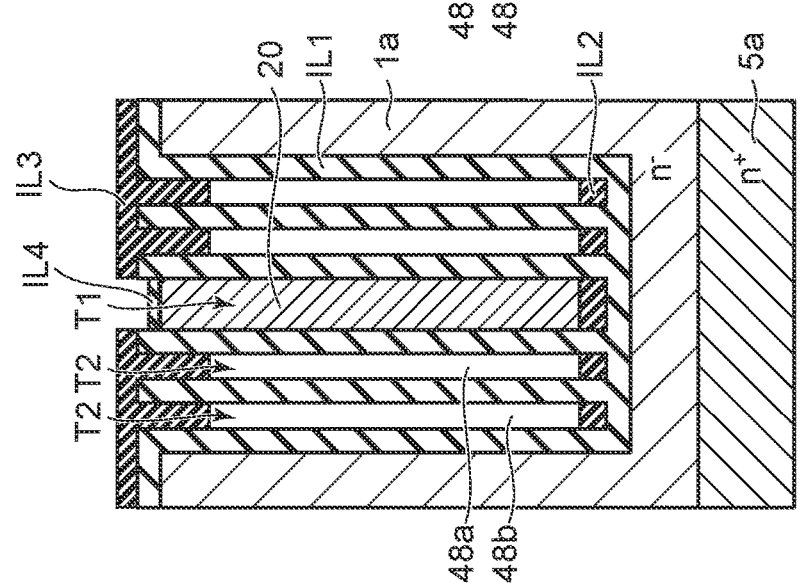

Next, an insulating layer IL5 along the inner side surface of the n$^-$-type semiconductor layer 1a is formed by thermally oxidizing the inner side surface of the exposed n$^-$-type semiconductor layer 1a. Subsequently, a conductive layer is formed inside the trench T3. The gate electrode 10 is formed by performing etching back on the upper surface of the conductive layer (FIG. 3C). Subsequently, a portion of the insulating layer IL1 and a portion of the insulating layer IL3 are removed by etching.

Figure 4C:
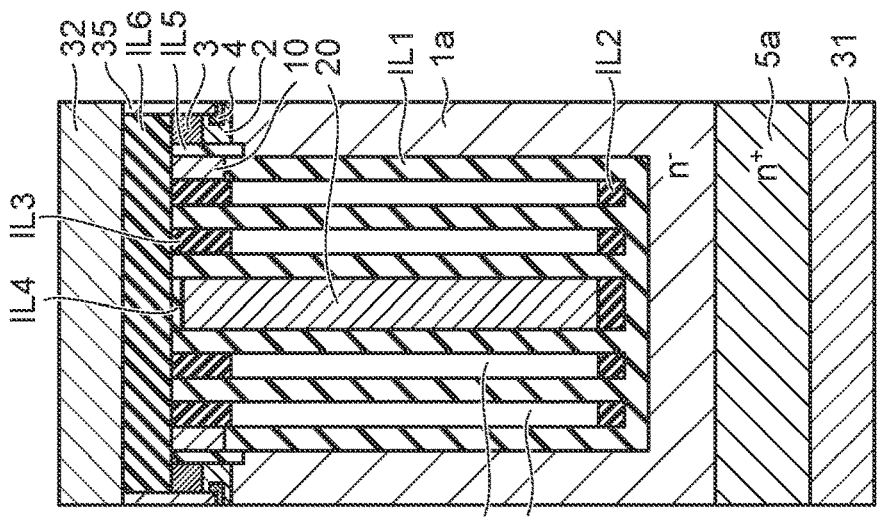
FIGS. 4A to 4C are process cross-sectional views showing an example of a process of manufacturing the semiconductor device according to the first embodiment.
Figure 4B:
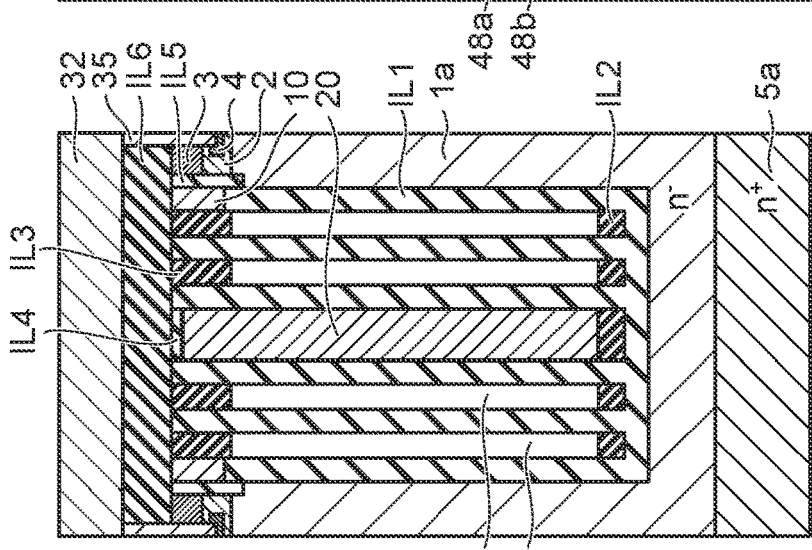
Figure 4A:
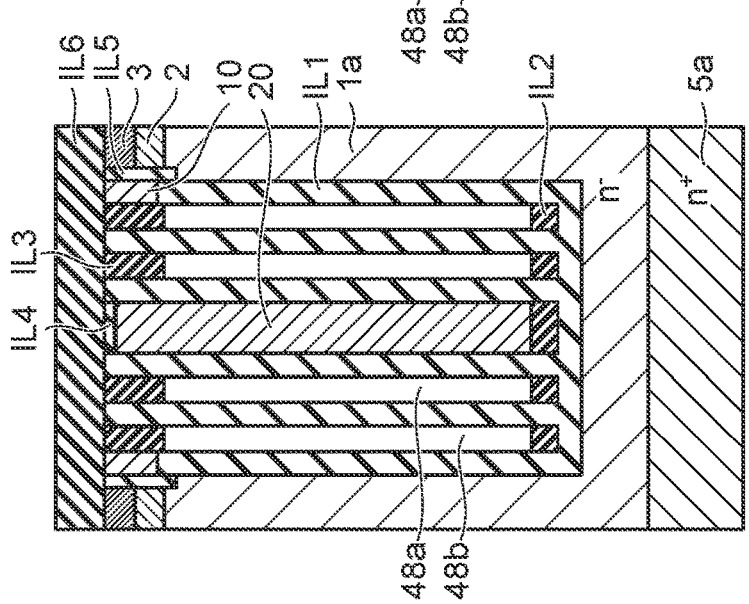

Next, the impurities to be acceptors and the impurities to be donors are sequentially ion-implanted into the n$^-$-type semiconductor layer 1a located on the side of the insulating layer IL5. Accordingly, the p-type base region 2 and the n$^+$-type source region 3 are formed. Subsequently, an insulating layer IL6 is formed on the gate electrode 10, the insulating layer IL3, the insulating layer IL4, and the insulating layer IL5 (FIG. 4A).

Next, an opening is formed that extends (or pass) through the insulating layer IL6 and the n$^+$-type source region 3 in the first direction D1 and reaches the p-type base region 2, and the impurities to be acceptors are ion-implanted into a portion of the p-type base region 2 through the opening. Accordingly, the p$^+$-type contact region 4 is formed. Subsequently, a metal layer covering the n$^+$-type source region 3, the p$^+$-type contact region 4, and the insulating layer IL6 is formed. Accordingly, the source electrode 32 and the via 35 are formed (FIG. 4B).

Next, the back surface of the n$^+$-type semiconductor layer 5a is ground until the n$^+$-type semiconductor layer 5a has a predetermined thickness, and a metal layer is formed on the n$^+$-type semiconductor layer 5a. Accordingly, the drain electrode 31 is formed (FIG. 4C).

The semiconductor device 100 shown in FIG. 1 is obtained by the processes described above. The n$^-$-type semiconductor layer 1a corresponds to, for example, the n$^-$-type drift region 1. The n$^+$-type semiconductor layer 5a corresponds to, for example, the n$^+$-type drain region 5. The insulating layer IL1 corresponds to, for example, the first insulating region 41, the second insulating region 42, the first portion 43a of the third insulating region 43, and the fifth insulating region 45. The insulating layer IL2 corresponds to, for example, the second portion 43b of the third insulating region 43. The insulating layer IL3 corresponds to, for example, the fourth insulating region 44. A portion of the insulating layer IL5 corresponds to, for example, the gate insulating portion 50. The insulating layer IL6 corresponds to, for example, the interlayer insulating portion 60.

It is noted that, with respect to the above-described manufacturing method, a chemical vapor deposition (CVD) method can be used for forming each insulating layer and each conductive layer unless otherwise specified. A physical vapor deposition (PVD) method or a plating method can be used to form each metal layer.

In addition, as the etching of each insulating layer and each conductive layer, unless otherwise specified, wet etching, a reactive ion etching (RIE) method, a chemical dry etching (CDE) method, and the like can be appropriately selected and used.

Next, a variation of the method for manufacturing the semiconductor device 100 will be described with reference to FIG. 5A to FIG. 6B.

FIGS. 5A to 5C and FIGS. 6A and 6B are process cross-sectional views showing the variation of the process of manufacturing the semiconductor device according to the first embodiment.

Figure 5C:
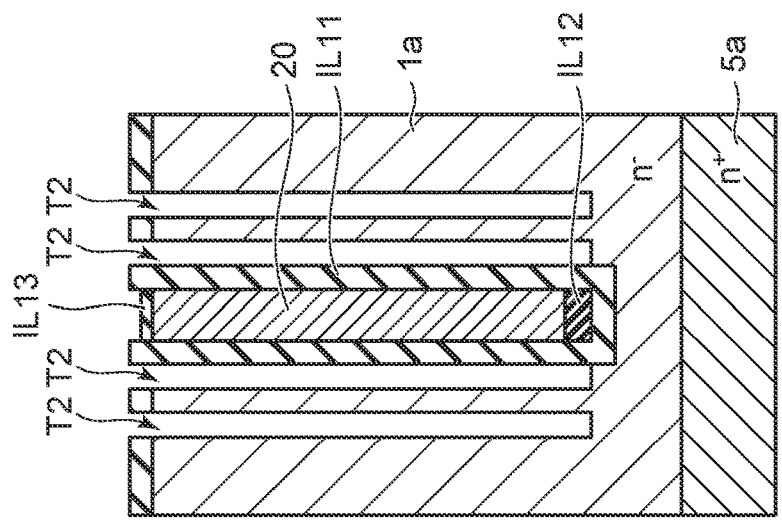
FIGS. 5A to 5C are process cross-sectional views showing a variation of the process of manufacturing the semiconductor device according to the first embodiment.
Figure 5B:
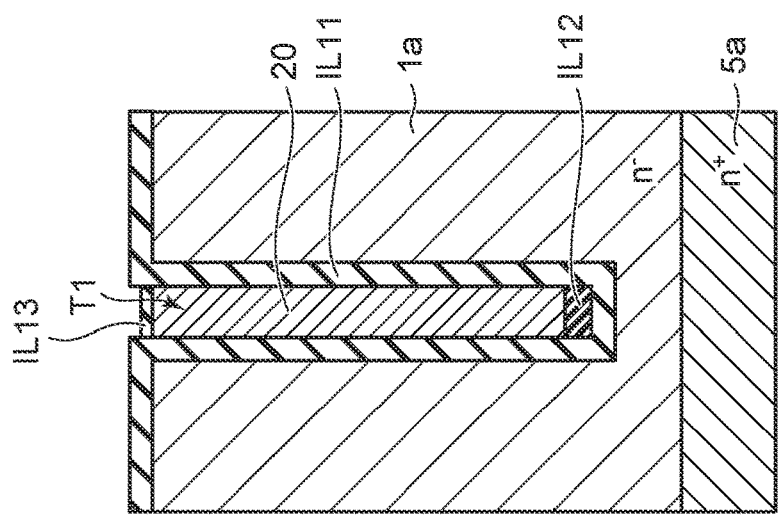
Figure 5A:
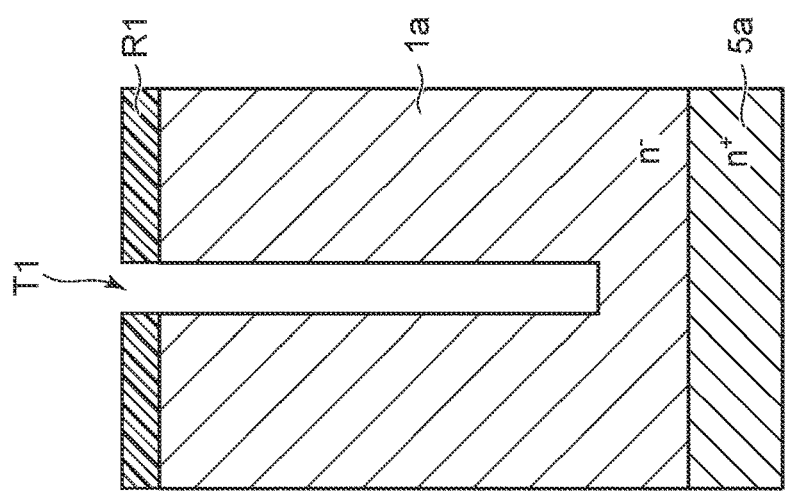

In the variation, first, a semiconductor substrate including the n$^+$-type semiconductor layer 5a and the n$^-$-type semiconductor layer 1a is prepared, and the main trench T1 is formed on the surface of the n$^-$-type semiconductor layer 1a by photolithography and etching using the resist R1 (FIG. 5A).

Next, the resist R1 is removed, and an insulating layer IL11 along the inner surface of the main trench T1 and the upper surface of the n⁻-type semiconductor layer 1a is formed by thermally oxidizing the n⁻-type semiconductor layer 1a. Next, an insulating layer IL12 is formed on the bottom of the main trench T1. Subsequently, a conductive layer is formed inside the main trench T1, and the FP electrode 20 is formed by performing etching back on the upper surface of the conductive layer. Subsequently, an insulating layer IL13 along the upper surface of the FP electrode 20 is formed by thermally oxidizing the upper portion of the FP electrode 20 (FIG. 5B).

Figure 6A:
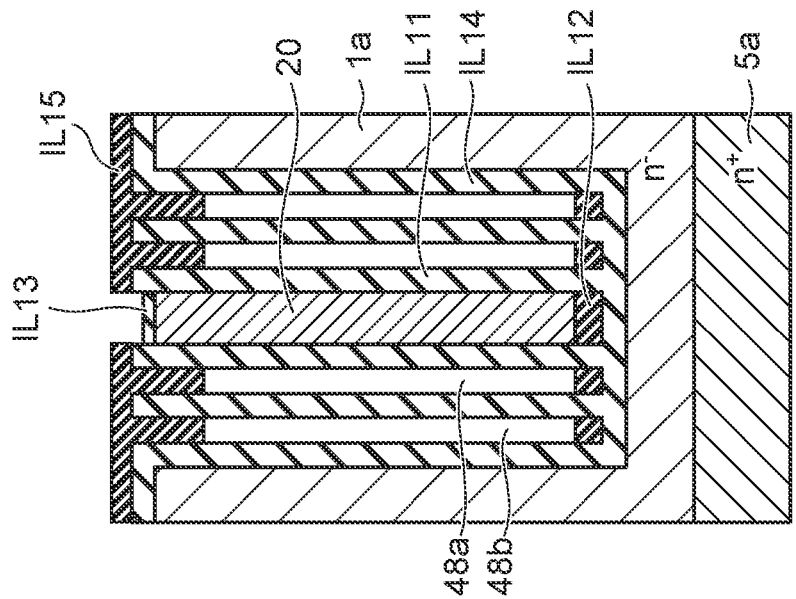
FIGS. 6A and 6B are process cross-sectional views showing a variation of the process of manufacturing the semiconductor device according to the first embodiment.
Figure 6B:
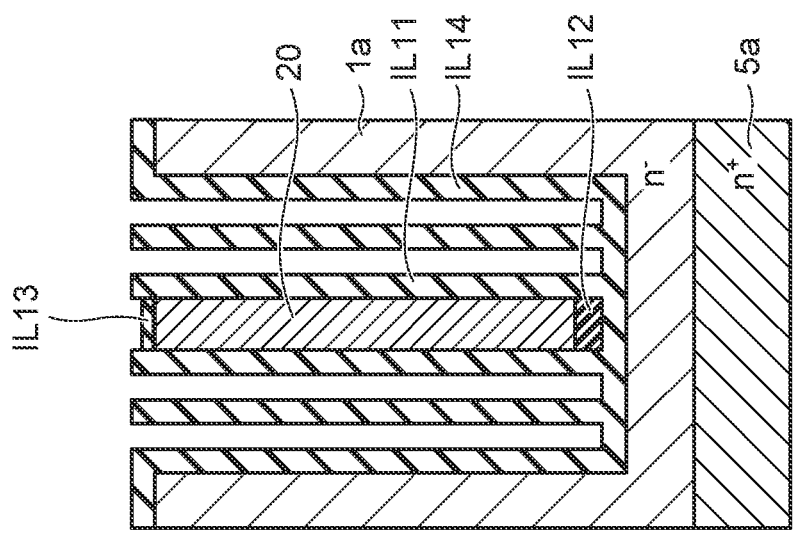

Next, a portion of the insulating layer IL11 is removed on the side of the FP electrode 20, and the side trench T2 is formed from the surface of the n⁻-type semiconductor layer 1a into the n⁻-type semiconductor layer 1a (FIG. 5C). Next, an insulating layer IL14 along the side trench T2 is formed by thermally oxidizing the n⁻-type semiconductor layer 1a (FIG. 6A). Next, an insulating layer IL15 is formed so as to close the upper portion of the side trench T2 (FIG. 6B).

The subsequent processes can be performed in the same manner as the processes subsequent to FIG. 3B described above. It is noted that the insulating layer IL11 and the insulating layer IL14 correspond to the insulating layer IL1. The insulating layer IL12 corresponds to the insulating layer IL2. The insulating layer IL13 corresponds to the insulating layer IL4. The insulating layer IL15 corresponds to the insulating layer IL3.

As described above, the semiconductor device 100 can also be manufactured by the method of forming the side trench T2 after forming the FP electrode 20 and after that, forming the insulating layer of the side trench T2.

Next, another variation of the method for manufacturing the semiconductor device 100 will be described with reference to FIG. 7A to FIG. 8B.

FIGS. 7A to 7C and FIGS. 8A and 8B are process cross-sectional views showing another variation of the process of manufacturing the semiconductor device according to the first embodiment.

In the variation, first, a semiconductor substrate having the n⁺-type semiconductor layer 5a and the n⁻-type semiconductor layer 1a is prepared, and the main trench T1 is formed on the surface of the n⁻-type semiconductor layer 1a by photolithography using the resist R1 (FIG. 7A).

Next, the resist R1 is removed, and an insulating layer IL21 along the inner surface of the main trench T1 and the upper surface of the n⁻-type semiconductor layer 1a is formed by thermally oxidizing the n⁻-type semiconductor layer 1a. Subsequently, the FP electrode 20 is formed by forming a conductive layer inside the main trench T1 (FIG. 7B).

Next, the upper surface of the n⁻-type semiconductor layer 1a is exposed by performing etching back on the upper surface of the insulating layer IL21 (FIG. 7C). Next, the side trench T2 is formed from the surface of the insulating layer IL21 into the insulating layer IL21 on the side of the FP electrode 20 by photolithography and anisotropic etching using the resist R2 (FIG. 8A).

Next, the resist R2 is removed, and an insulating layer IL22 is formed so as to close the upper portion of the side trench T2. Subsequently, the insulating layer IL22 on the FP electrode 20 is removed, and an insulating layer IL23 along the upper surface of the FP electrode 20 is formed by thermally oxidizing the upper portion of the FP electrode 20 (FIG. 8B).

The subsequent processes can be performed in the same manner as the processes subsequent to FIG. 3B described above. It is noted that the insulating layer IL21 corresponds to the insulating layer IL1 and the insulating layer IL2. The insulating layer IL22 corresponds to the insulating layer IL3. The insulating layer IL23 corresponds to the insulating layer IL4.

As described above, the semiconductor device 100 can also be manufactured by the method of forming the side trench T2 inside the insulating layer after forming the FP electrode 20 and the insulating layer.

Herein, the function and effect of the embodiment will be described.

As a method for reducing the parasitic capacitance in the semiconductor device, it is considered to increase the thickness of the FP insulating portion 40 provided around the FP electrode 20. However, when the thickness of the FP insulating portion 40 is increased, the warpage of the wafer becomes large, and there is a concern that a problem may occur in the carrying of the wafer.

In the semiconductor device according to the embodiment, by providing the air-gap region 48 inside the FP insulating portion 40, it is possible to reduce the dielectric constant of the entire FP insulating portion 40 while suppressing the increase in thickness of the FP insulating portion 40, and it is possible to reduce the parasitic capacitance. In addition, since the warpage of the wafer can be absorbed by the air-gap region 48, it is possible to suppress the occurrence of a problem in carrying due to the warpage of the wafer. In addition, since the relative permittivity in air or vacuum is lower than the relative permittivity of silicon oxide or the like, the air-gap region 48 is provided, so that the insulating property of the FP insulating portion 40 can be improved in comparison with a case where the air-gap region 48 is not provided (that is, the entire FP insulating portion 40 is made of silicon oxide or the like). Therefore, by providing the air-gap region 48, the thickness of the FP insulating portion 40 can be reduced in comparison with a case where the air-gap region 48 is not provided. Accordingly, the time and cost required for manufacturing the semiconductor device can be reduced.

Second Embodiment

Figure 9:
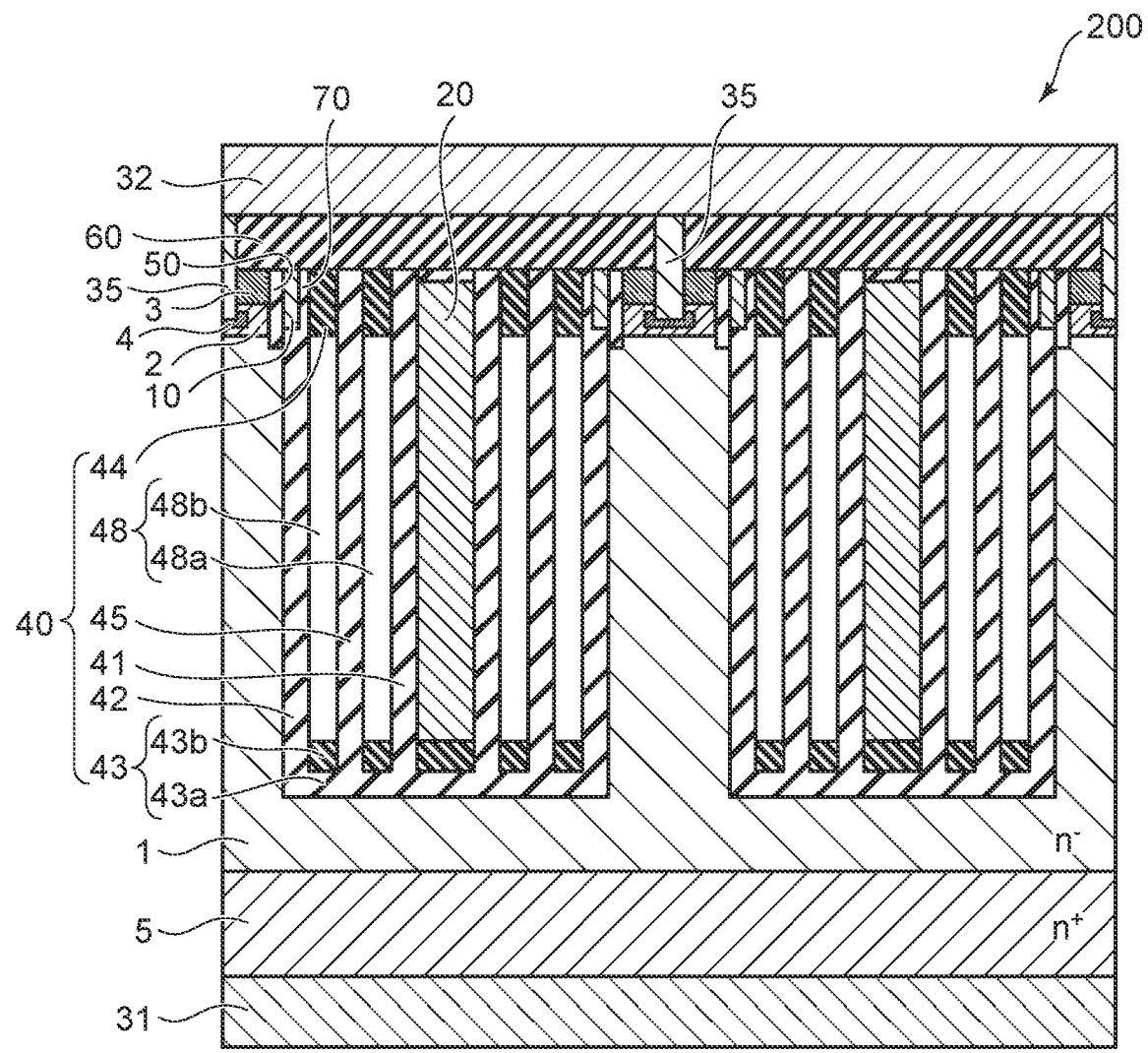
FIG. 9 is a cross-sectional view showing a semiconductor device according to a second embodiment.

FIG. 9 is a cross-sectional view showing a semiconductor device according to a second embodiment.

As shown in FIG. 9, in a semiconductor device 200 according to the second embodiment, a fourth insulating portion 70 is provided between the gate electrode 10 and the fourth insulating region 44 in the second direction D2. In the other points, the semiconductor device 200 is the same as the semiconductor device 100 according to the first embodiment. The fourth insulating portion 70 contains an insulating material. The fourth insulating portion 70 contains, for example, silicon oxide or silicon nitride.

The fourth insulating portion 70 can be formed by, for example, the following method. For example, in the process of FIG. 3B described above, the fourth insulating portion 70 can be formed by forming the trench T3 so that a portion of the insulating layer IL1 remains between the trench T3 and the insulating layer IL3. Alternatively, for example, in the process of FIG. 3C described above, the fourth insulating portion 70 may be formed by thermally oxidizing a portion of the gate electrode 10 in contact with the insulating layer IL3 by oxygen permeating through the insulating layer IL3.

Also in the semiconductor device 200, the air-gap region 48 is provided inside the FP insulating portion 40, so that it is possible to reduce the parasitic capacitance while suppressing the increase in thickness of the FP insulating portion 40. In addition, the air-gap region 48 is provided, so that it is possible to suppress the occurrence of a problem in carrying due to the warpage of the wafer. In addition, the air-gap region 48 is provided, so that the thickness of the FP insulating portion 40 can be reduced in comparison with a case where the air-gap region 48 is not provided.

As described above, according to the embodiment of the invention, there is provided a semiconductor device capable of reducing parasitic capacitance.

While certain embodiments of the invention have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such embodiments or variations as would fall within the scope and spirit of the inventions. In addition, each of the above-described embodiments can be implemented in a combination of the embodiments.

What is claimed is:

1. A semiconductor device, comprising:
   a first electrode;
   a first conductivity type first semiconductor region provided on the first electrode;
   a second conductivity type second semiconductor region provided on the first semiconductor region;
   a first conductivity type third semiconductor region selectively provided on the second semiconductor region;
   a second electrode provided on the third semiconductor region and electrically connected to the third semiconductor region;
   a third electrode aligned with the first semiconductor region and the second semiconductor region in a second direction perpendicular to a first direction from the first electrode toward the first semiconductor region;
   a gate electrode provided between the third electrode and the second semiconductor region in the second direction;
   a first insulating portion including a first insulating region provided between the third electrode and the first semiconductor region in the second direction and facing the third electrode in the second direction, a second insulating region facing the first semiconductor region in the second direction, and at least one air-gap region located between the first insulating region and the second insulating region in the second direction; and
   a second insulating portion provided between the gate electrode and the second semiconductor region in the second direction,
   a distance between the first electrode and a lower end of the third electrode being less than a distance between the first electrode and a lower end of the gate electrode, and
   the first insulating region being located between the third electrode and the air-gap region in the second direction.

2. The device according to claim 1, wherein the air-gap region does not overlap the third electrode in the first direction.

3. The device according to claim 1, wherein the first insulating portion includes a third insulating region located between the air-gap region and the first semiconductor region and between the third electrode and the first semiconductor region in the first direction.

4. The device according to claim 3, wherein a thickness of the third insulating region in the first direction is larger than a thickness of the second insulating region in the second direction.

5. The device according to claim 1, wherein the first insulating portion includes a fourth insulating region located between the air-gap region and the second electrode in the first direction.

6. The device according to claim 1,
   wherein the first insulating portion includes a fifth insulating region located between the first insulating region and the second insulating region in the second direction, and
   the air-gap region includes a first air-gap region located between the first insulating region and the fifth insulating region in the second direction and a second air-gap region located between the fifth insulating region and the second insulating region in the second direction.

7. The device according to claim 1, wherein multiple third electrodes and the first insulating portions are provided along the second direction, and the second semiconductor region is located between the multiple third electrodes in the second direction, the air-gap regions are located between the multiple third electrodes in the second direction.

\* \* \* \* \*